US009001606B2

(12) United States Patent
Vogelsang et al.

(10) Patent No.: US 9,001,606 B2
(45) Date of Patent: Apr. 7, 2015

(54) MEMORY METHODS AND SYSTEMS WITH ADIABATIC SWITCHING (75) Inventors: Thomas Vogelsang, Mountain View, CA (US); Brent Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 298 days.

(21) Appl. No.: 13/703,339

(22) PCT Filed: Aug. 22, 2011

(86) PCT No.: PCT/US2011/048571
§ 371 (c)(1),
(2), (4) Date: Dec. 10, 2012

(87) PCT Pub. No.: WO2012/027250
PCT Pub. Date: Mar. 1, 2012

(65) Prior Publication Data
US 2013/0114353 A1    May 9, 2013

Related U.S. Application Data (60) Provisional application No. 61/377,813, filed on Aug. 27, 2010.

(51) Int. Cl.
*G11C 7/02* (2006.01)
*G11C 5/14* (2006.01)
*G11C 7/08* (2006.01)
*G11C 7/12* (2006.01)
*G11C 11/4074* (2006.01)
*G11C 11/408* (2006.01)
*G11C 11/4091* (2006.01)
*G11C 11/4094* (2006.01)
*G11C 7/00* (2006.01)

(52) U.S. Cl.
CPC ...... *G11C 5/147* (2013.01); *G11C 7/08* (2013.01); *G11C 7/12* (2013.01); *G11C 11/4074* (2013.01); *G11C 11/4085* (2013.01); *G11C 11/4091* (2013.01); *G11C 11/4094* (2013.01); *G11C 7/00* (2013.01)

(58) Field of Classification Search
CPC . G11C 11/4074; G11C 16/30; G11C 11/5642
USPC .............. 365/207, 205, 203; 327/52, 55, 57
See application file for complete search history.

(56) References Cited

U.S. PATENT DOCUMENTS 5,337,271 A     8/1994  Kawahara et al. ............ 365/149
5,446,694 A *   8/1995  Tanaka et al. ................ 365/203
(Continued)

OTHER PUBLICATIONS

Karakiewicz, Rafal et al., "175 GMACS/mW Charge-Mode Adiabatic Mixed-Signal Array Processor," 2006 Symposium on VLSI Circuits, 2006. Digest of Technical Papers. 2 pages.
(Continued)

*Primary Examiner* — Vu Le
(74) *Attorney, Agent, or Firm* — Silicon Edge Law Group LLP; Arthur J. Behiel (57) ABSTRACT A memory system includes wordlines and pairs of complementary bitlines that provide access to memory storage elements. Capacitive and resistive loads associated with wordlines and bitlines are driven relatively slowly between voltage levels to reduce peak current, and thus power dissipation. Power dissipation is further reduced by charging complementary bitlines at substantially different rates.

23 Claims, 6 Drawing Sheets (56) References Cited

U.S. PATENT DOCUMENTS

| | | | | |
|---|---|---|---|---|
| 5,811,997 | A | 9/1998 | Chengson | 327/112 |
| 5,905,685 | A * | 5/1999 | Nakamura et al. | 365/207 |
| 2006/0077729 | A1 | 4/2006 | Lin et al. | 365/189.11 |
| 2008/0079458 | A1 | 4/2008 | Shin et al. | 326/30 |
| 2009/0010086 | A1 | 1/2009 | Hong et al. | 365/207 |
| 2009/0067273 | A1 | 3/2009 | Koike et al. | 365/203 |
| 2009/0161463 | A1 | 6/2009 | Choi | 365/206 |
| 2009/0251982 | A1 | 10/2009 | Ware | 365/222 |
| 2010/0128545 | A1 | 5/2010 | Lee et al. | 365/205 |
| 2010/0214822 | A1 | 8/2010 | Ware | 365/149 |

OTHER PUBLICATIONS

Burger, John Robert, "Associative Memory for Reversible Programming and Charge Recovery," Burger Review Copy dated Feb. 2006 and presented at CoRR. 18 pages.

Hang, Guoqiang, "Adiabatic CMOS gate and adiabatic circuit design for low-power applications," Proceedings of the Asia and South Pacific Design Automation Conference, 2005, pp. 803-808 vol. 2, Jan. 18-21, 2005. 6 pages.

Bobich, Benjamin, "Adiabatic Switching: A Survey of Reversible Computation Circuits," PowerPoint presentation dated 2004. 30 pages.

Kawahara et al., "A Charge Recycle Refresh for Gb-Scale DRAM's in File Applications," IEEE Journal of Solid-State Circuits, vol. 29 (Jun. 1994). p. 715-722. 8 pages.

PCT Response submitted Oct. 19, 2011 re Int'l Application No. PCT/US2011/048571. 4 Pages.

PCT Preliminary Examination Report and Written Opinion dated Feb. 9, 2012 re Int'l. Application No. PCT/US11/048571. 9 Pages.

* cited by examiner

MEMORY METHODS AND SYSTEMS WITH ADIABATIC SWITCHING

TECHNICAL FIELD

The present embodiments relate to techniques for saving power within memory systems. More specifically, the present embodiments relate to methods and circuits for performing low-power memory operations using variable supply voltages to charge capacitive elements.

BACKGROUND

Advances in computing technology make it possible to perform trillions of computational operations per second on data sets that are sometimes as large as a trillion bytes. These advances can be largely attributed to the exponential increase in the operating speed and complexity of integrated circuits (ICs). These increases in speed and complexity have been accompanied by a corresponding increase in power consumption. Memory, ubiquitous in computer systems, is responsible for a considerable share.

Power consumption is, of course, generally undesirable due to the monetary and environmental costs associated with the creation, delivery, and storage of electricity. The energy-storage issue is particularly troublesome for mobile computing devices because the desired levels of processing power are incompatible with small, inexpensive batteries. There is therefore a demand for more efficient computing devices, which can be met in part by more efficient memories.

BRIEF DESCRIPTION OF THE FIGURES

The subject matter disclosed is illustrated by way of example, and not by way of limitation, in the figures of the accompanying drawings and in which like reference numerals refer to similar elements and in which.

DETAILED DESCRIPTION

Circuit elements, including conductors that convey electrical signals, exhibit a capacitance C that must be charged by a flow of current to express a voltage change. In general, the time required to change a voltage by an amount V is proportional to the current I used to charge the capacitance C. Circuit elements also offer some resistance R to the flow of electrical current, which limits the speed at which the capacitance can be charged, and consequently limits the speed at which voltage can be changed.

Circuit elements express changing signals as changing voltage levels. Because the speed at which voltage changes is limited by the current provided to induce a voltage change, speed performance changes linearly with charging current I (e.g., doubling the charging current for a given signal line doubles speed performance). However, power dissipation through a resistance R is proportional to the square of current I (e.g., doubling the charging current for a given signal line quadruples power dissipation). Increasing current to improve speed performance thus comes at the expense of considerably increased power dissipation. Conversely, reducing current reduces speed performance, but provides disproportionately higher efficiency. This property is used to advantage is circuits that employ "adiabatic" switching for improved efficiency. The underlying theory is that some circuit elements can be switched very slowly, using low charging currents, to minimize power dissipation.

Figure 1:
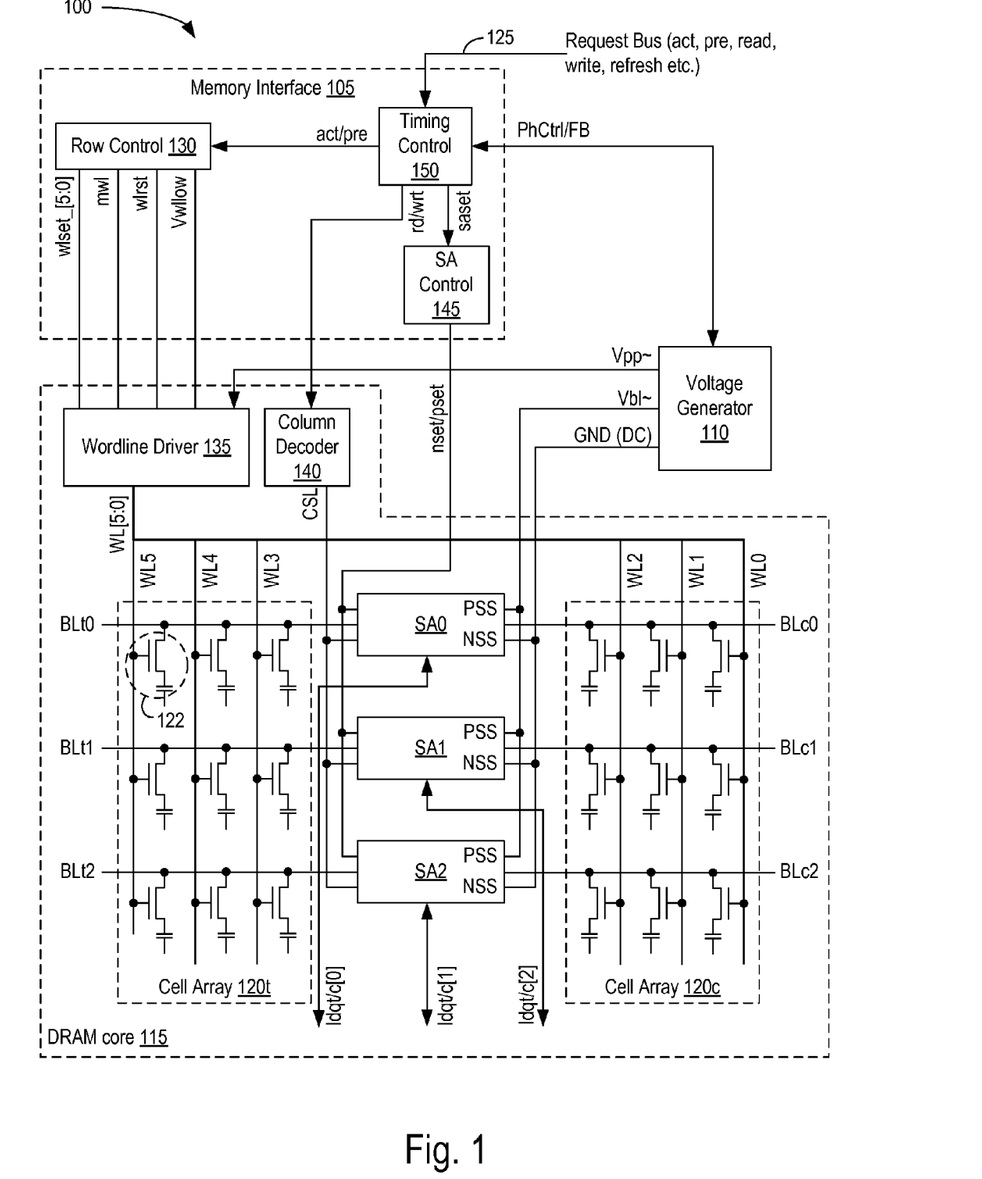
FIG. 1 depicts a memory 100 that employs adiabatic switching to reduce power consumption without adversely impacting speed performance.

FIG. 1 depicts a memory 100 that employs adiabatic switching to reduce power consumption. Capacitive and resistive loads associated with conductors used to access arrays of memory cells are driven relatively slowly between voltage levels to reduce peak current, and thus power dissipation. The rates of voltage change are established using supply voltages that vary with time. Memory commands are synchronized with the varying supply voltages so that the supply voltages are at desired levels when commands are executed.

Memory 100 includes a memory interface 105, a voltage generator 110, and a memory core 115. Core 115 is a dynamic, random-access memory (DRAM) core in this example, and includes memory-cell arrays 120t and 120c, each of which includes rows and columns of memory cells 122. A set of sense amplifiers SA[2:0] are connected to cell arrays 120t and 120c by respective sets of bitlines BLt[2:0] and BLc[2:0], which allow the sense amplifiers to read from and write to selected memory cells. As with other designations herein, the designations BLt[2:0] and BLc[2:0] refer both to physical nodes and their corresponding signals; whether a given designation refers to a node or a signal will be clear in context. Memory core 115 additionally includes a wordline driver 135 and a column decoder 140 to communicate control signals from interface 105 to cell arrays 120t/c and sense amplifiers SA[2:0] as detailed below.

A conventional memory controller (not shown) issues requests to memory 100 via a request bus 125. In DRAM devices, such requests instruct core 115 to activate wordlines, precharge bitlines, and read from, write to, and refresh the contents of memory cells 122 within arrays 120t and 120c. Memory interface 105 conventionally includes row-control circuit 130 and sense-amplifier control circuitry 145 to develop the requisite control signals to induce core 115 to respond to the requests. These control signals include wordline set signal wlset_[5:0], main-wordline signal mwl, and wordline reset signal wlrst from row control circuit 130, and sense-amplifier set signals nset and /pset from sense-amplifier control circuitry 145. These components and the control signals they instigate are well known to those of skill in the art, so a detailed discussion is omitted for brevity.

Voltage generator 110 develops two varying supply voltages Vpp~ and Vbl~, both of which are conveyed to core 115 in this example. By controlling the timing of control signals act/pre, rd/wrt, and saset, a timing-control circuit 150 within interface 105 synchronizes the application of control signals WL[5:0], CSL, and nset and /pset within core 115 to the variations of the supply voltages. Supply voltages Vpp~ and Vbl~ are sinusoidal in this example, but can take different forms in other embodiments.

Supply voltage Vpp~ is applied to wordlines WL[5:0] to gain access to selected memory cells. The application of voltage Vpp~ to the wordlines is timed to raise the wordline voltage relatively slowly to reduce peak current, and consequently power dissipation.

Each of sense amplifiers SA[2:0] is coupled to a complementary pair of bitlines, one that extends into array 120t and another into array 120c, and receives constant and variable supply voltages GND and Vbl~ on respective N-sense supply node NSS and P-sense supply node PSS. If a memory cell in one cell array is being accessed, the complementary bitline in the other cell array serves as a reference. As in conventional DRAMs, accessing a memory cell creates a small voltage difference between complementary bitlines; the respective sense amplifier drives the lower of the two bitline voltages lower and the higher of the two bitline voltages higher to sense the contents of the memory cell. In the depicted embodiment, the lower of the two bitline voltages is rapidly pulled toward ground potential while the higher of the two is pulled high relatively slowly by application of supply voltage Vbl~. Though perhaps counterintuitive, quickly lowering one bitline voltage and slowly raising its complement reduces power usage as compared with changing both bitline voltages quickly, or changing both slowly.

Memory 100 can be instantiated on a single semiconductor die as a discrete integrated circuit (IC). Alternatively, one or more components of memory 100 can be instantiated separately. For example, voltage generator 110 and all or part of memory interface 105 can be coupled to a semiconductor die that embodies memory core 115, or memory interface 105 and core 115 can be instantiated together on the same die to receive supply voltages from an external voltage generator 110.

Conventional memory devices contain hierarchical groupings of memory cells. For example, arrays of memory cells are arranged in rows and columns, collections of such arrays can be grouped into larger arrays, which can be collected into banks, etc. Signals that are not memory-cell specific may be shared across multiple cells or collections of cells. In the example of FIG. 1, signals shared among various collections of memory cells include control signals wlset_[5:0], mwl, and wlrst from row control circuit 130; voltages Vwllow, Vpp~, Vbl~, and ground; column-select signal CSL; and sense-amplifier control signals nset and /pset. Many arrangements are possible, and are familiar to those of skill in the art. A detailed discussion of the hierarchical use of the various conventionally applied signals is unnecessary for understanding the disclosed embodiments, and is therefore omitted.

Figure 2:
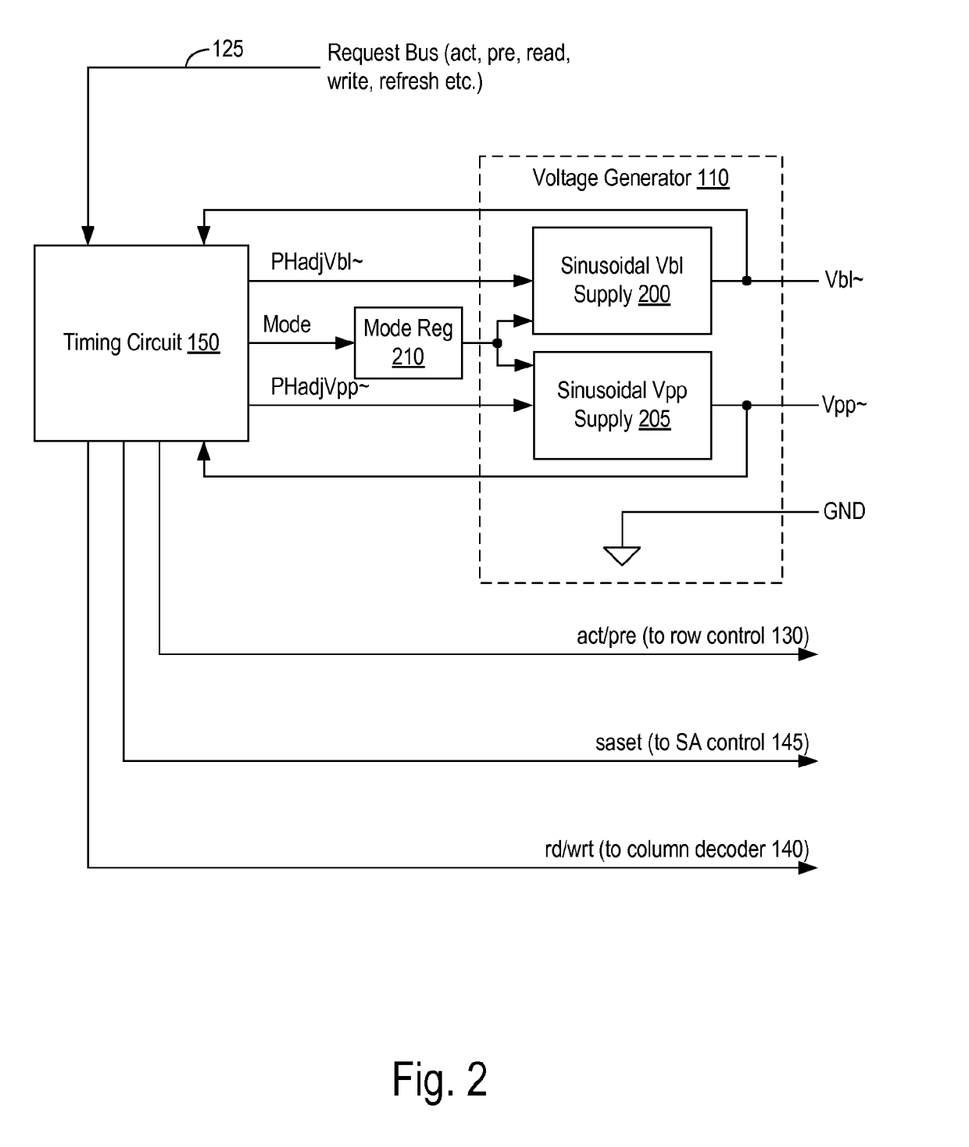
FIG. 2 is a block diagram of timing-control circuit 150 and voltage generator 110 of FIG. 1 in accordance with one embodiment.

FIG. 2 is a block diagram of timing-control circuit 150 and voltage generator 110 of FIG. 1 in accordance with one embodiment. Voltage generator 110 includes two sinusoidal supplies 200 and 205, which produce respective sinusoidal supply voltages Vbl~ and Vpp~. These voltages are fed back to timing-control circuit 150 to provide a measure of phase Timing-control circuit 150 issues phase-adjustment signals PHadjVbl~ and PHadjVpp~ to the respective supplies to synchronize the application of control signals to memory core 115 with the phases of the supply voltages as detailed below. Sinusoidal voltage generators and methods of controlling them are well understood by those of skill in the art.

Using varying voltages Vbl~ and Vpp~ to drive their respective capacitive and resistive loads at speeds that are slow relative to the RC time constant of those loads reduces power dissipation. Timing-control circuit 150 and voltage generator 110 may therefore support different operational modes that allow them to select different power and performance tradeoffs. In some embodiments, memory 100 can be configured to selectively operate in either a high-speed mode in which constant supply voltages are used in place of voltages Vpp~ and Vbl~ or in a low-power mode that employs varying supply voltages as described herein. In other embodiments different functions can operate at different speeds in the same mode. In DRAMs, for example, self-refresh operations are generally less time critical than read and write accesses. The power-saving methods and circuits described herein may therefore be used for self refresh, while faster, more power intensive, methods and circuits can be used to perform read and write operations. In one embodiment timing-control circuit 150 switches modes responsive to a request on bus 125 by loading an appropriate mode value into a mode register 210 that may be part of or separate from voltage generator 110.

Figure 3:
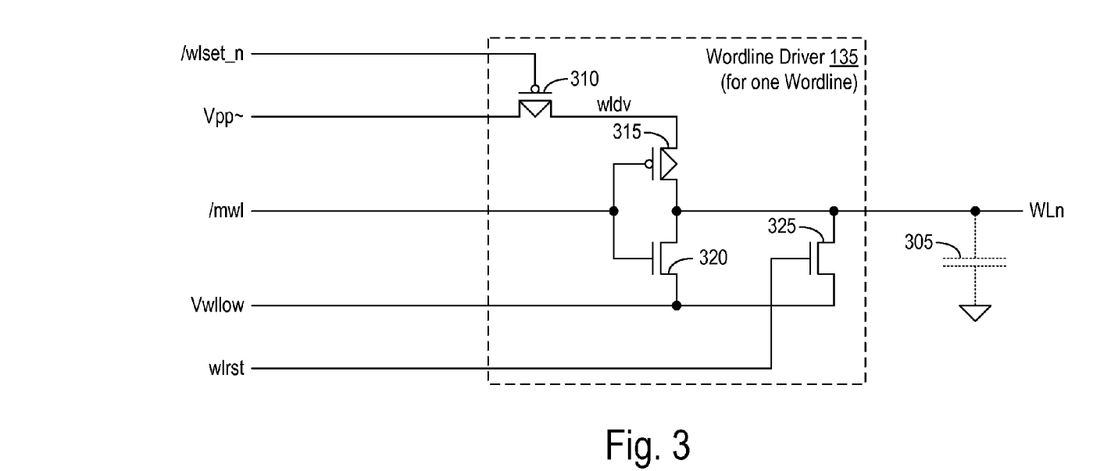
FIG. 3 illustrates a portion of wordline driver 135 of FIG. 1 in accordance with an embodiment that uses adiabatic switching to reduce the power dissipation associated with the charging of parasitic wordline capacitances.

FIG. 3 illustrates a portion of wordline driver 135 of FIG. 1 in accordance with an embodiment that uses adiabatic switching to reduce the power dissipation associated with the charging of parasitic wordline capacitances. The depicted portion of driver 135 is limited to one wordline WLn and associated parasitic capacitance 305 for ease of illustration. Driver 135 includes four transistors 310, 315, 320, and 325. Transistors 310, 315, and 320 are used to raise wordline-select signal WLn to a voltage suitable for activating selected memory cells 122 (FIG. 1), and to do so gradually to reduce peak current and consequently power dissipation. Transistor 325 resets wordline-select signal WLn to a low voltage Vwllow when a reset signal wlrst is asserted. Though not shown, reset signal wlrst applies to more than one wordline.

Figure 4:
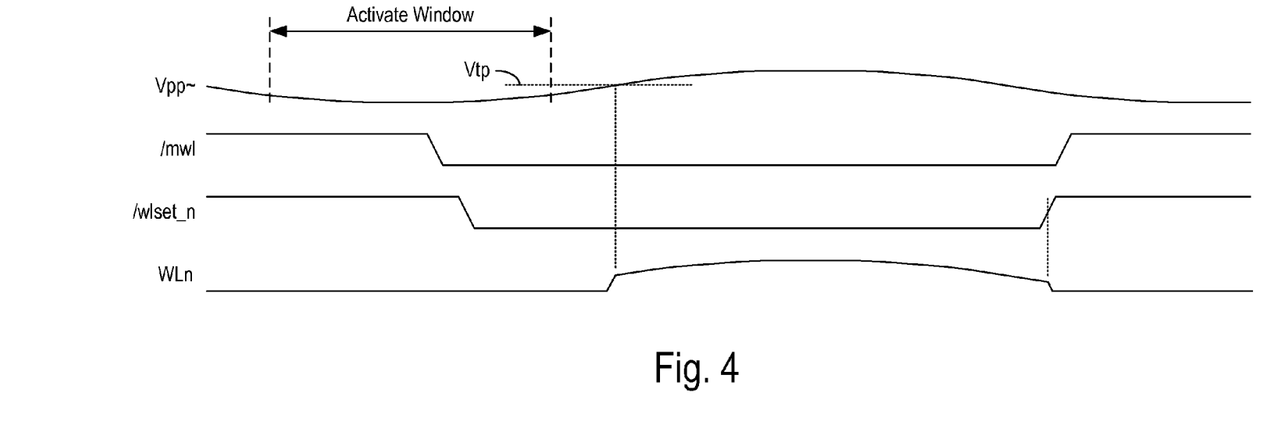
FIG. 4 is a waveform diagram 400 illustrating the assertion of wordline-select signal WLn using wordline driver 135 of FIG. 1.

FIG. 4 is a waveform diagram 400 illustrating the assertion of wordline-select signal WLn using wordline driver 135 of FIG. 1. This illustration assumes wordline WLn is precharged to voltage Vwllow, and reset signal wlrst is no longer asserted (i.e., transistor 325 is in a high-impedance state). Driver 135 receives a wordline-set signal /wlset_n and a master wordline-select signal /MWL; in each reference the preceding "/" connotes that these signals are asserted by bringing them low. These signals control more than one wordline, but their wider application is unnecessary for understanding the disclosed embodiments.

If voltage Vpp~ were relatively high at this point, transistors 315 and 320 would invert the asserted master wordline-select signal /mwl and wordlines select signal WLn would go high. This does not happen immediately, however, as timing-control circuit 150 (FIG. 1) times assertion of signals /wlset_n and /mwl to occur in a trough of sinusoidal supply voltage Vpp~. Wordline-select signal WLn begins to rise when supply voltage Vpp~ rises to a voltage Vtp high enough to allow transistors 310 and 315 to turn on. Thereafter, the voltage on wordline-select signal WLn follows the contour of supply voltage Vpp~ until signal /wlset_n is deasserted. By this time, as described below in connection with FIG. 6, the sense amplifiers associated with the memory cells of the selected wordline will have captured the contents of the memory cells.

Wordline control signals /wlset_n and /mwl are then deasserted to return wordline WLn to its precharged condition in anticipation of the next cycle.

Employing a varying supply voltage to charge wordline capacitance 305 reduces peak current through the wordline and associated control circuitry, and consequently reduces power dissipation. Moreover, capacitance 305 discharges toward the power supply as supply voltage Vpp~ drops and transistors 310 and 315 are on, which recycles some of the charge used to access the memory cells to save still more power.

Figure 5:
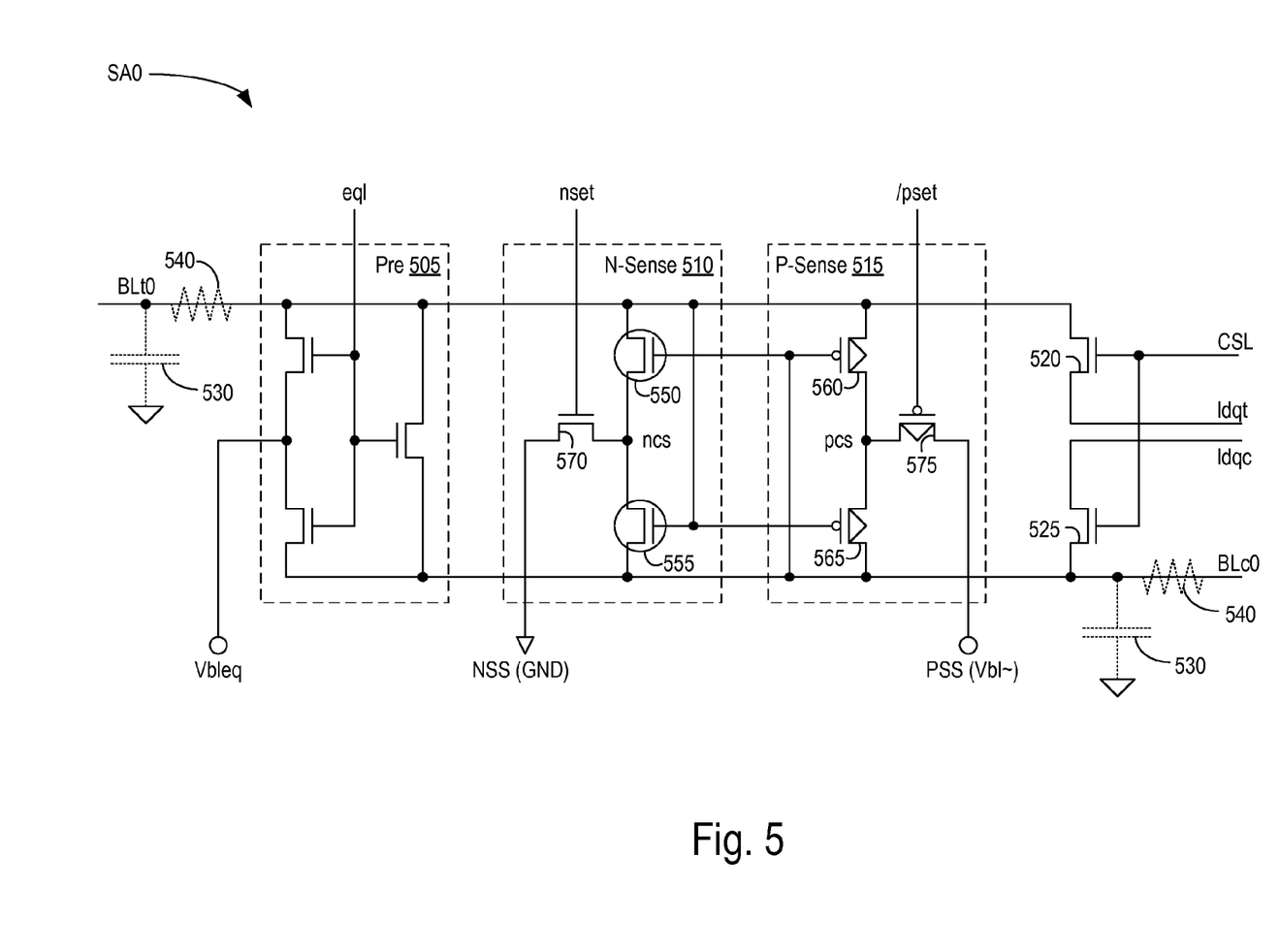
FIG. 5 depicts sense amplifier SA0 of FIG. 1 in accordance with one embodiment.

FIG. 5 depicts sense amplifier SA0 of FIG. 1 in accordance with one embodiment. Sense amplifier SA0 is schematically conventional, but varying supply voltage Vbl~ is used in synchronization with sense-amplifier control signals to adiabatically switch one of the associated complementary bitlines BLt0 and BLc0. As in the wordline example discussed previously, adiabatic switching of the bitlines saves power.

The function of sense amplifier SA0 will be described in detail in connection with FIG. 6. Briefly, sense amplifier SA0 includes precharge circuitry 505, complementary sense circuits 510 and 515, and a pair of access transistors 520 and 525. Precharge circuitry 505, in preparation for a read operation, precharges bitlines BLt0 and BLc0 to the same precharge voltage, the level of which is established by a reference signal Vbleq. Next, a memory cell coupled to one of bitlines BLt0 and BLc0 is opened by a wordline operation, such as of the type described previously. Charge from the open memory cell is shared with the parasitic capacitance 530 of the respective bitline, and consequently changes the bitline voltage. As a result, the voltages on the complementary bitlines are slightly different.

To sense the voltage difference between complementary bitlines, timing-control circuit 150 (FIG. 1) asserts senseamplifier set signal saset, which induces control circuit 145 to assert both set signals nset and /pset. The set signals enable transistors 570 and 575, which are commonly shared among multiple sense circuits, causing sense circuits 510 and 515 to amplify the voltage difference between the two bitlines. In particular, sense circuit 510 pulls the lower of the two bitline voltages toward ground and sense circuit 515 raises the higher of the two bitline voltages toward Vbl~. The speed at which sense circuit 510 pulls the lower of the two bitline voltages toward ground is heavily dependent upon the values of parasitic capacitance 530 and parasitic resistance 540 of that bitline. The speed at which sense circuit 515 pulls the high of the two bitline voltages upward is much slower, depending primarily on the speed at which supply voltage Vbl~ rises. Quickly pulling the lower of the two bitline voltages toward ground minimizes the crowbar current through sense circuits 510 and 515, and does not contribute to the power since it is dissipating the charge back to supply node Vss, which is ground in this example.

Once sense circuits 510 and 515 have had an opportunity to amplify the voltage difference between the two bitlines, column-select signal CSL is asserted to enable access transistors 520 and 525 to convey the disparate voltages as true and complementary data signals Idqt and Idqc representative of the value read from the selected memory cell. Data signals Idqt/Idqc are local to their respective cell arrays. A column multiplexer/demultiplexer (not shown) selects between these and similar local data signals from other cell arrays to provide data DQ to and from core 115. These data input/output structures are well known to those of skill in the art, and are therefore omitted.

Figure 6:
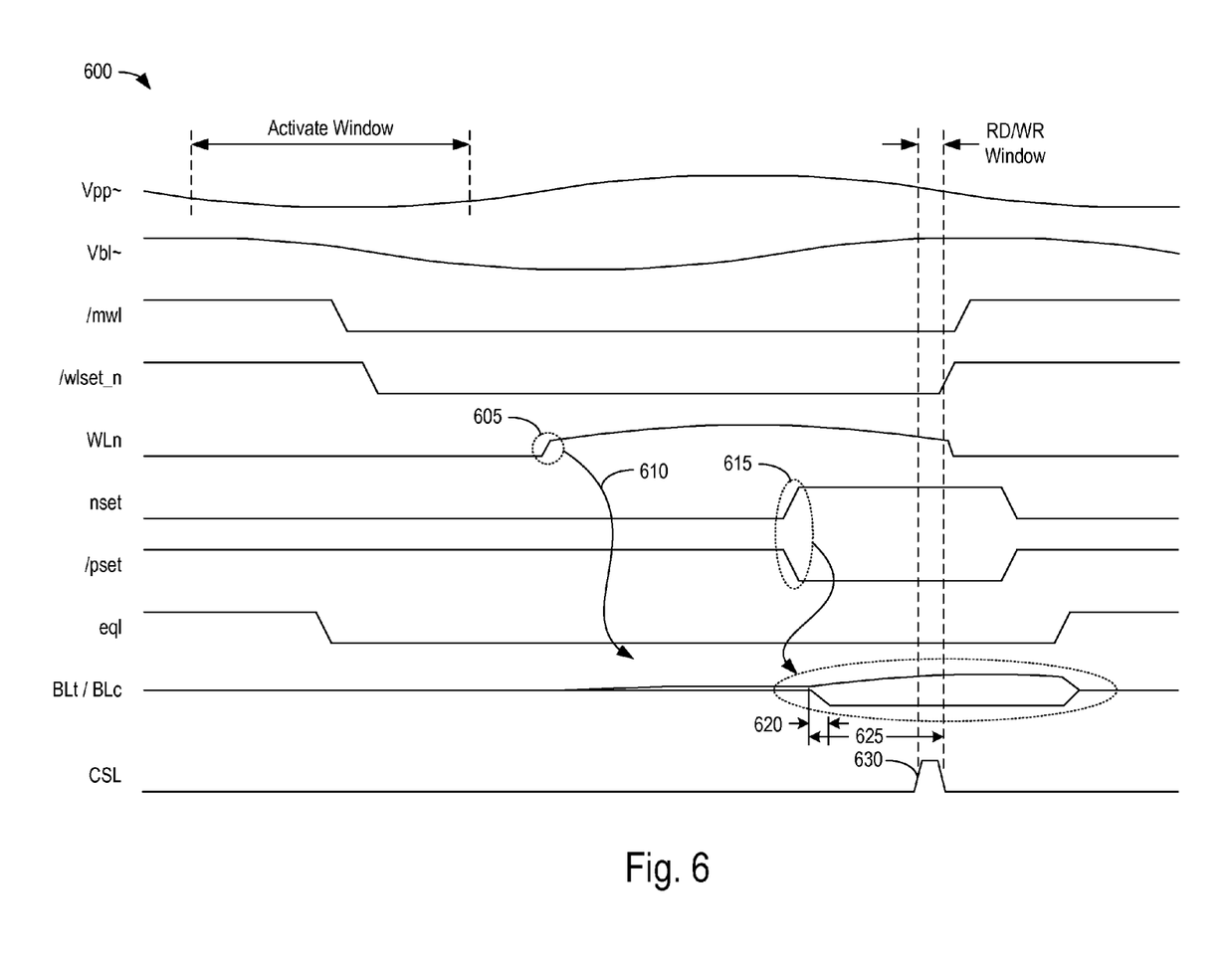
FIG. 6 is a waveform diagram 600 illustrating the combined operation of wordline driver 135 of FIGS. 1 and 3 and sense amplifier SA0 of FIGS. 1 and 5.

FIG. 6 is a waveform diagram 600 illustrating the combined operation of wordline driver 135 of FIGS. 1 and 3 and sense amplifier SA0 of FIGS. 1 and 5. The operation is as detailed previously up until the rise of wordline-select signal WLn, which begins at an edge 605. Assertion of the wordline signal opens a memory cell coupled to one of bitlines BLt and BLc, which causes the bitline voltages to diverge. In the example of FIG. 6, the storage cell contained a quantity of charge that slightly raised bitline voltage BLt. An arrow 610 indicates the causal relationship between the assertion of wordline-select signal WLn and the divergence of the bitline voltages.

Signals nset and /pset are both asserted at 615, simultaneously in this embodiment, to enable sense circuits 510 and 515, which respond by amplifying the difference between the two bitline voltages. Sense circuit 510 pulls the lower of the two bitline voltages toward ground potential at a speed largely depending upon the RC time constant of the respective bitline, which results in a relatively rapid voltage change 620. Sense circuit 515 pulls the higher of the two bitline voltages higher, but the speed of this voltage change is limited by the rate of change of supply voltage Vbl~. The relatively slow charging time 625 of one bitline voltage reduces peak current, and consequently power dissipation. Column select signal CSL is asserted at 630 to connect the bitlines to respective differential data lines Idqt and Idqc (FIG. 5). A read/write (RD/WR) window during which signal CSL is asserted coincides with a time during which wordline signal WLn is sufficiently high to support the writing of data back to the memory cell. (FIG. 6 is not to scale: in one embodiment, for example, the period of voltage Vbl~ is 200 ns and signal CSL is asserted for about 2 ns.)

When signal nset is first asserted, node ncs (FIG. 5) rapidly falls from the preset voltage level to ground potential. Both transistors 550 and 555 begin to conduct as the voltage difference between node ncs and the bitlines approaches their identical threshold levels. The slight difference between the gate voltages on transistors 550 and 555 causes the one with the higher gate voltage to conduct more strongly than the other, driving one of the bitlines low. The resultant low bitline voltage is fed back to the one of transistors 550 and 555 with the initially lower gate voltage to turn it off.

When set signal nset is first asserted, the voltage at node pcs is equal to the preset bitline voltages. Transistors 560 and 565 therefore conduct essentially no current. Before voltage Vbl~ increases appreciably, N-sense circuit 510 drives the lower of the two bitline voltages toward ground, as noted previously, which greatly reduces the impedance through the one of transistors 560 and 565 coupled to the higher of the two bitline voltages and holds the other of transistors 560 and 565 off. The higher of the two bitline voltages then rises relatively slowly with supply voltage Vbl~.

Assume, for example, that bitline BLt0 is slightly high relative to bitline BLc0 when transistors 570 and 575 are biased on to initiate a sense operation. The gate of transistor 555 will be slightly higher than that of transistor 550, so transistor 555 will offer less resistance to current flow as node ncs falls toward ground. Transistor 555 will pull bitline BTc0 low, ultimately to ground potential, which will bias transistor 550 off and transistor 560 on. Bitline BTt0 then rises relatively slowly with supply voltage Vbl~.

Published international application WO 2009061532 entitled "VOLTAGE-STEPPED LOW-POWER MEMORY DEVICE," by Frederick A. Ware and Yoshihito Koya, describe sense amplifiers in which the supply nodes to the sense circuits of the type depicted in FIG. 5 are both varied over the course of a sense operation to save power. Simulations have shown, however, that varying the supply voltage to one sense circuit and maintaining the other constant over the course of a sense operation saves still more power. This result is counterintuitive, and was not expected. The application to Ware and Koya is incorporated herein by reference. The reason for the improvement is that all transistors of sense circuits 510 and 515 are partially on when set signals nset and /pset are first asserted but the bitlines have yet to be sensed. Drawing voltage ncs down quickly speeds the switching of sense circuits 510 and 515, which minimizes leakage between nodes NSS and PSS.

Figure 7:
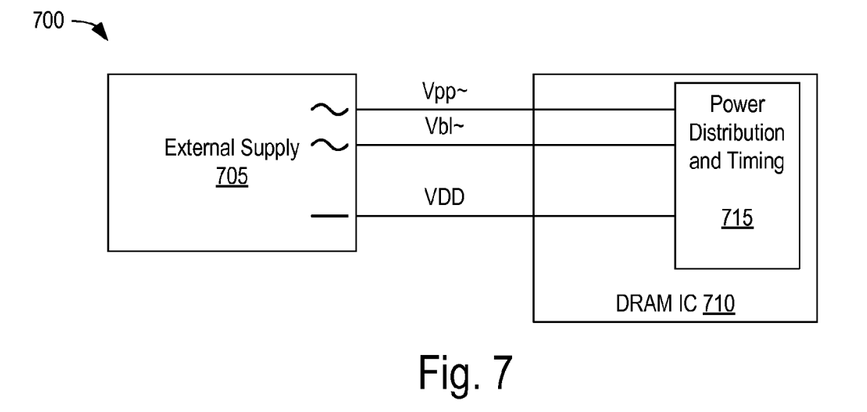
FIG. 7 depicts a memory 700 in accordance with an embodiment in which a variable voltage generator 705 serves as an external power supply for an integrated memory circuit 710.

FIG. 7 depicts a memory 700 in accordance with an embodiment in which a variable voltage generator 705 serves as an external power supply for an integrated memory circuit 710. Memory circuit 710 includes power distribution and timing circuitry 715, and may additionally include e.g. interface 105 and DRAM core 115 of FIG. 1. Circuitry 715 receives supply voltages Vpp~, Vbl~, and VDD from external generator 705, derives internal supply voltages from these external signals, and times memory commands as needed to synchronize them with the changing external supply voltages. Circuitry 715 can produce other needed supply and reference levels from e.g. voltage VDD.

Figure 8:
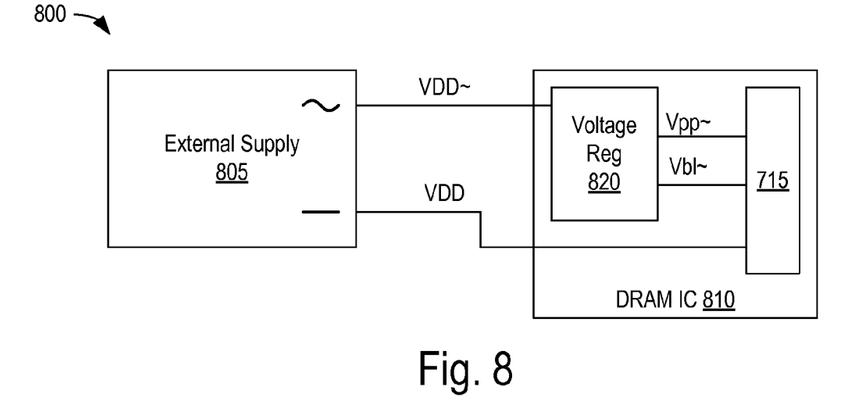
FIG. 8 depicts a memory 800 in accordance with another embodiment. In this example, an external supply 805 generates DC and sinusoidal supply voltages VDD and VDD~ for a DRAM IC 810.

FIG. 8 depicts a memory 800 in accordance with another embodiment. In this example, an external supply 805 generates DC and sinusoidal supply voltages VDD and VDD~ for a DRAM IC 810. A voltage regulator 820 derives sinusoidal signals Vpp~ and Vbl~ from the externally provided voltage VDD~, and distribution and timing circuitry 715, introduced in FIG. 7, times and distributes them as appropriate. In other embodiments signals Vpp~ and Vbl~ can be phase adjusted within regulator 820, and voltages Vpp~ and Vbl~ can be generated from voltage VDD or from a combination of voltages VDD and VDD~.

Figure 9:
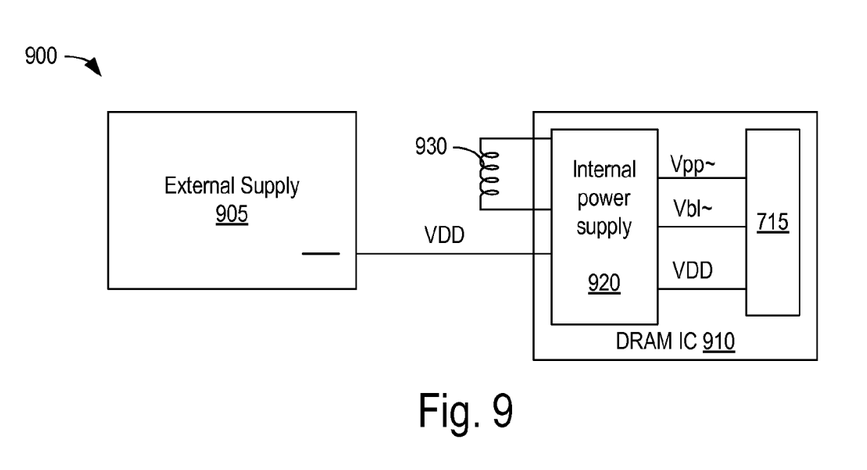
FIG. 9 depicts a memory 900 in accordance with yet another embodiment. An external supply 905 generates a DC supply voltage VDD for a DRAM IC 910.

FIG. 9 depicts a memory 900 in accordance with yet another embodiment. An external supply 905 generates a DC supply voltage VDD for a DRAM IC 910. A power supply 920 internal to DRAM IC 910 uses an external or internal inductor 930 to generate sinusoidal supply signals Vpp~ and Vbl~. DRAM 910 otherwise functions like memory circuits 710 and 810 of FIGS. 7 and 8, respectively. Circuits for creating sinusoidal waveforms from DC supply voltages are well known, so a detailed discussion is omitted for brevity. In the example of FIG. 9, inductor 930 is provided externally with respect to DRAM 910 because inductors of significant value are difficult to integrate in an area-efficient manner.

Varying supply voltages are sinusoidal in the foregoing embodiments, but other waveforms might also be used. In the above-referenced application to Ware and Koya, for example, step-wise changes in supply voltages provide similar advantages.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments. While the example of FIG. 6 shows how both the wordline and bitline voltages may be varied in a manner that reduces current and consequently power consumption, only one of the wordline and bitline voltages can be so varied in other embodiments.

As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. Additionally, the prefix symbol "/" attached to signal names indicates that the signal is an active low signal (i.e., the asserted state is a logic low state). In any case, whether a given signal is an active low or an active high will be evident to those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. For example, the foregoing examples can be adapted for use in various array architectures, including the well-known open bitline and folded bitline architectures. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. Section 112.

What is claimed is:
1. A memory comprising:
  a voltage generator to provide a varying supply voltage; and a memory core having storage cells and sense amplifiers, each sense amplifier having an N-sense supply node to receive a constant supply voltage, and a P-sense supply node coupled to the voltage generator to receive the varying supply voltage;

a memory interface coupled to the memory core to issue memory-control signals; and timing-control circuitry coupled to the memory interface and the voltage generator, the timing-control circuitry to synchronize the varying supply voltage with the memory-control signals.

2. The memory of claim 1, wherein the voltage generator is to provide a second varying supply voltage, the memory core includes a wordline, the memory-control signals include a wordline-select signal, and the timing-control circuitry synchronizes the wordline-select signal with the second varying supply voltage.

3. The memory of claim 2, wherein the second varying supply voltage is sinusoidal.

4. The memory of claim 1, wherein the varying supply voltage is sinusoidal.

5. The memory of claim 1, the memory core including, for each sense amplifier, a complementary pair of bitlines, each bitline connected to a respective one of the sense nodes; and wherein each sense amplifier amplifies a voltage difference between the respective pair of complementary sense nodes by selectively connecting one of the bitlines to the N-sense supply node while connecting the other of the bitlines to the P-sense supply node.

6. The memory of claim 5, wherein a first bitline voltage on the bitline connected to the N-sense supply node changes at a first rate determined by an RC time constant of the bitline connected to the N-sense supply node and a second bitline voltage on the bitline connected to the P-sense supply node changes at a second rate determined by variations of the varying supply voltage.

7. The memory of claim 6, wherein the first rate is at least five times the second rate.

8. A method for charging a capacitive energy storage device of a memory cell from an initial voltage to a final voltage, the method comprising:

comparing the initial voltage to a reference voltage;

if the initial voltage is less than the reference voltage, rapidly pulling the energy storage device down to the final voltage; and if the initial voltage is greater than the reference voltage, gradually pulling the energy storage device up to the final voltage.

9. The method of claim 8, wherein rapidly pulling the energy storage device down to the final voltage comprises connecting the energy storage device to a DC node.

10. The method of claim 9, wherein gradually pulling the energy storage device up to the final voltage comprises connecting the energy storage device to a varying supply node.

11. The method of claim 8, wherein comparing the initial voltage to a reference voltage comprises comparing a bitline voltage of a bitline coupled to the memory storage device to the reference voltage, and wherein rapidly pulling the energy storage device down to the final voltage discharges the energy storage device and the bitline at a rate determined by an RC time constant of a memory cell and the bitline.

12. The method of claim 11, wherein gradually pulling the energy storage device up to the final voltage charges the energy storage device and bitline at a second rate independent of the RC time constant.

13. The method of claim 12, wherein the second rate follows a varying supply voltage.

14. The method of claim 8, wherein the energy storage device is coupled to a first bitline, and wherein comparing the initial voltage to the reference voltage comprises comparing the initial voltage on the first bitline with the reference voltage on a second bitline, and wherein the method further comprises:

gradually pulling the second bitline up from the reference voltage if the initial voltage is less than the reference voltage; and rapidly pulling the second bitline down from the reference voltage if the initial voltage is greater than the reference voltage.

15. An integrated circuit comprising:

a memory core having sense amplifiers selectively coupled to bitline pairs, each sense amplifier including a P-sense supply node coupled to a varying supply voltage and an N-sense supply node coupled to a constant supply voltage;

a memory interface coupled to the memory core to issue control signals; and timing control circuitry coupled to the memory interface to synchronize the control signals with the varying supply voltage.

16. The integrated circuit of claim 15, further comprising a sinusoidal voltage generator coupled to the memory core to provide the varying supply voltage.

17. The integrated circuit of claim 15, wherein the memory interface includes a wordline driver to issue wordline-select signals to the memory core, the wordline driver having a supply node to receive a second varying supply voltage.

18. The integrated circuit of claim 17, wherein the timing control circuitry synchronizes memory commands to the second varying supply voltage.

19. The integrated circuit of claim 18, wherein the second varying supply voltage is sinusoidal.

20. A memory comprising:

a voltage generator to provide a varying supply voltage;

a wordline driver coupled to the voltage generator to receive the varying supply voltage and to assert a wordline signal;

memory cells coupled to the wordline driver via a wordline to receive the wordline signal; and timing-control circuitry coupled to the wordline driver and the voltage generator, the timing-control circuitry to synchronize the varying supply voltage with the wordline signal.

21. The memory of claim 20, wherein the varying supply voltage is sinusoidal, and wherein the wordline signal follows the varying supply voltage.

22. The memory of claim 20, wherein the wordline exhibits an RC time constant, and wherein application of the wordline signal changes a wordline voltage at a rate independent of the RC time constant.

23. The memory of claim 22, wherein the rate is determined by a period of the varying supply voltage.

* * * * *